United States Patent [19]

Boll

[11] 4,292,677

[45] Sep. 29, 1981

[54] SELF-REFRESHED CAPACITOR MEMORY CELL

[75] Inventor: Harry J. Boll, Berkeley Heights, N.J.

[73] Assignee: Bell Telephone Laboratories, Incorporated, Murray Hill, N.J.

[21] Appl. No.: 109,777

[22] Filed: Jan. 7, 1980

[51] Int. Cl.³ .............................................. G11C 13/00
[52] U.S. Cl. .................................... 365/222; 365/189
[58] Field of Search ....................... 365/222, 189, 230

[56] References Cited

U.S. PATENT DOCUMENTS 4,203,159  5/1980  Wanlass .............................. 365/222

*Primary Examiner*—Terrell W. Fears
*Attorney, Agent, or Firm*—David I. Caplan

[57] ABSTRACT

This invention involves a capacitor memory cell ($C_S$) of, typically the metal-oxide-semiconductor (MOS) capacitor type, which is accessed for reading and writing by means of an access network connected to the memory cell through a gating transistor ($T_1$), and which is provided with an independent refresh network for maintaining the memory state of the cell in the absence of an access writing signal. The refresh network includes a pair of MOSFET (Metal Oxide Semiconductor Field-Effect Transistors) transistors ($T_2$, $T_3$) connected between the MOS capacitor and an A.C. refresh line which is independent of the electrical access network. Either a "full" or "empty" capacitor memory state, binary digital 1 or 0, respectively, is maintained without the need for interrupting the reading and writing of the MOS capacitor.

4 Claims, 2 Drawing Figures

SELF-REFRESHED CAPACITOR MEMORY CELL

FIELD OF THE INVENTION

This invention relates to the field of semiconductor memory apparatus, and more particularly to memory cells utilizing an MOS capacitor as the memory storage element.

BACKGROUND OF THE INVENTION

Metal-insulator-semiconductor (MIS), and more specifically metal-oxide-semiconductor (MOS) capacitor memory cells are forms of dynamic memory cells. In an MIS capacitor dynamic memory cell, the information is stored in the form of the presence vs absence of charge in a capacitor, thereby representing a binary digital state or bit of information. By "dynamic" is meant that the information in either one or the other (or both) of the two possible states tends to become degraded and to disappear with the passage of time.

An MOS capacitor memory cell in P-MOS technology can take the form of, for example, a portion of the surface of an N-type semiconductor body ("substrate") covered with a silicon dioxide insulator layer upon which is located a metal or metal-like electrical conducting plate. This conducting plate of the resulting MOS storage capacitor structure is maintained at a fixed negative reference voltage while electrical writing and reading pulses are applied to the semiconductor substrate surface portion of the capacitor underlying the plate. A positive-going voltage (or current) write-in pulse, applied to the semiconductor surface portion of the MOS storage capacitor, injects positive charges ("hole" minority carriers) into this semiconductor substrate surface portion, thereby bringing the MOS capacitor (P-MOS technology) into its binary digital "1" memory state ("full" of positive charge). On the other hand, a negative-going voltage (or current) write-in pulse applied to the semiconductor surface portion removes these positive charges from the semiconductor substrate surface portion, thereby sharply reducing the amount of positive charge in the semiconductor surface portion and bringing the MOS capacitor (P-MOS technology) into its binary digital "0" memory state ("empty" of positive charge). However, this binary 0 state tends to become degraded with the passage of time subsequent to the negative-going write-in pulse, because of the thermal regeneration of spurious minority carriers (positively charged holes) in the N-type semiconductor substrate. This degradation takes place within a time of the order of the semiconductor's thermal regeneration time, typically of the order of a few milliseconds or less. However, even in the face of this degradation of the "0" state, a negative-going write-in voltage pulse can remove the positive charges from the MOS substrate surface portion and thereby can produce the binary 0 state of information for storage in the MOS capacitor at least for a short period of time; whereas, the presence of positive charges in the substrate surface portion due to a positive-going write-in pulse to the substrate can produce the more stable binary 1 for storage in the MOS capacitor.

In U.S. Pat. No. 4,030,083 issued to me on June 14, 1977, refresh networks were disclosed for maintaining the binary digital (1 or 0) state of an MOS (metal oxide semiconductor) storage capacitor memory cell. Such refresh networks enabled refresh of the memory without the need for interrupting the electrical access capability for reading or writing. The refresh networks basically involved the use of an auxiliary A.C. pump source connected through the refresh network to the storage capacitor; thereby the A.C. source removed the spurious charges which were being generated in the empty (digital 0) state of the capacitor. Although the specific networks disclosed in my aforementioned patent are implementable in present day MOS technology, it may sometimes be desirable to modify such networks.

SUMMARY OF THE INVENTION

Semiconductor apparatus in accordance with the invention includes a network for refreshing the memory state of a semiconductor capacitor memory cell ($C_s$) comprising a first transistor ($T_2$), one of whose high current carrying terminals is DC coupled to one terminal of the capacitor, and another of whose high current terminals is DC coupled to a refresh line terminal (13.1), characterized in that a low current carrying terminal of the first transistor ($T_2$) is DC coupled to one terminal of a two-terminal threshold resistive element ($T_3$ or R) whose other terminal is DC coupled to said one terminal of the first transistor ($T_2$). By "high current carrying terminal" is meant, for example, the source or drain of a metal oxide semiconductor field effect transistor (MOSFET), or the emitter or collector of a bipolar transistor. By "low current carrying terminal" is meant, for example, the gate electrode terminal of a MOSFET, or the base terminal of a bipolar transistor. The aforementioned resistive element can take the form of an MOS transistor, advantageously under a back-gate bias voltage, one of whose high current carrying terminals is ohmically coupled to its low current terminal, thereby forming a threshold resistive element; that is, an element which presents a very high resistance when a voltage exceeding a predetermined threshold is applied to the said one of its high current terminals. Alternately, the gate electrode of this MOSFET device can be omitted entirely, thereby the resulting device (MOSFET minus gate electrode) forms the desired two-terminal threshold resistive element.

DETAILED DESCRIPTION

Figure 1:
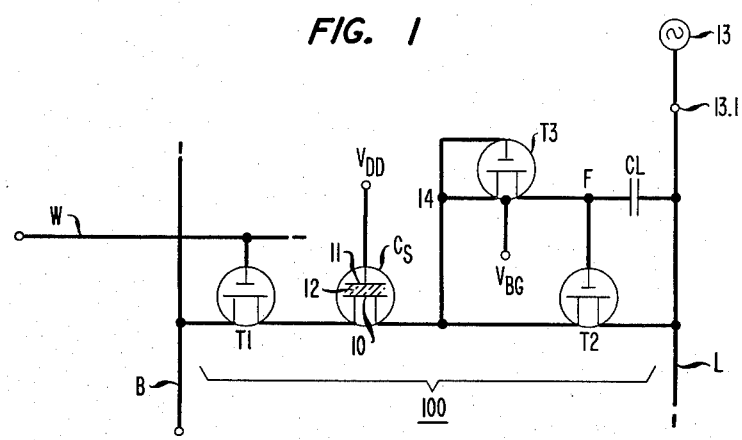
FIG. 1 is a preferred embodiment of the invention.

As shown in FIG. 1, a self-refreshed random access memory cell 100 includes an MOS capacitor cell $C_S$ together with MOS transistors $T_1$, $T_2$, $T_3$, and an auxiliary capacitor $C_L$ (which may be completely parasitic). The storage capacitor $C_S$ is typically formed by a metal (or metal-like) plate 11 separated by an oxide layer 12 from a corresponding semiconductive portion 10 of a major planar surface of a semiconductor body, such as a P-type single crystal silicon (N-channel or N-MOS technology). Advantageously, the transistors $T_1$, $T_2$, $T_3$ and the auxiliary capacitor $C_L$ are all integrated on the same major surface of this body, as understood in the art of integrated MOS circuits. During operation, the semiconductor body is advantageously maintained at a constant "back gate" voltage bias $V_{BG}$, typically of about $-5$ volts. The metal plate 11 is ohmically coupled to a terminal $V_{DD}$ which is advantageously maintained during operation at a constant positive voltage typically about $+12$ volts. This voltage $V_{DD}$, applied to the plate 11 in combination with the back gate bias $V_{BG}$ applied to the semiconductor body, produces in the capacitor $C_S$ a localized depletion region in the semiconductive portion 10 located underneath the plate 11. As explained more fully below, while the transistor $T_1$ controls external random access for write-in and read-out of the charge stored in this depletion region of the capacitor $C_S$, the transistors $T_2$ and $T_3$, and the auxiliary capacitor $C_L$ provide for automatic refresh of the charge stored in $C_S$ by means of refresh charges supplied by the refresh line L. This line L is able to furnish these refresh charges by virtue of its being connected to a refresh line terminal 13.1 to which an A.C. voltage pump source is applied.

The write-in of negative charge, i.e., digital 1 (N-MOS technology), to capacitor $C_S$ is achieved by a negative-going pulse on bit line B applied to the source of $T_1$ (left-hand terminal of $T_1$) accompanied by a positive-going pulse (turn "on") on the word line W applied to the gate of $T_1$; thereby the semiconductive portion 10 underneath the metal plate 11 is filled with negative charge carriers (electrons). Termination of the pulse to the gate of $T_1$ prior to the termination of the negative pulse to the source of $T_1$ thereby traps these negative charges in this portion 10 of capacitor $C_S$ by turning "off" the transistor $T_1$. This "off" condition persists even after the termination of the pulse to the source of $T_1$ by a return of bit line B to its normally positive voltage bias condition. Thus, the long-term nonvolatile trapping of charge, and hence storage of this digital 1 state in $C_S$ is achieved.

The write-in of a digital 0, i.e., substantially no charge in MOS capacitor $C_S$ (N-MOS technology), is accomplished by a positive-going pulse on word line W (to turn "on" $T_1$) while bit line B remains at its normally positive voltage. Thereby the capacitor $C_S$ is emptied of any negative charges in the semiconductive portion 10 associated with $C_S$.

Readout of the charge state 1 or 0 of $C_S$ is accomplished by a positive turn "on" pulse applied to word line W with bit line B still in its normally positive bias condition, thereby transferring negative charge (if any) from $C_S$ into bit line B for conventional readout, which may be followed by re-write if desired, as is known in the art. However, as time passes in the absence of refresh means, the thermal generation of minority carriers (electrons) would tend to fill an empty $C_S$ (digital 0) with undesired negative charge, thereby spuriously converting the memory state to a full capacitor $C_S$ (digital 1) and thus completely degrading the memory state.

Suppression of this degradation of the memory state of $C_S$ is achieved by means of a network of refresh elements: the transistor $T_2$ and $T_3$ in conjunction with the auxiliary capacitor $C_l$, and the refresh line L controlled by an A.C. pump source 13 applied to the terminal 13.1 of this refresh line. More specifically, this refresh network maintains the appropriate charge in $C_S$ corrresponding to the respective empty 0 state or full 1 state, until further write-in voltage pulses on either the word line or bit line; thereby, this network prevents degradation of the memory state between write-in or read-out operations without the need for any tampering with the word or bit lines otherwise required for the purpose of refresh. Advantageously, for this purpose of refresh, the A.C. voltage source 13 supplies a continuous uninterrupted (except as described below) alternating voltage to the refresh line, at a frequency of between typically about 10 KHz and 1 MHz. This AC voltage has an instantaneous amplitude varying between the limits of $+V$ and $+(V+\Delta)$. For convenience, $+V$ can be the same voltage $V_{DD}$ as applied to terminal 14, and $\Delta$ is typically in the range of about 5 to 10 volts, advantageously about 8 to 10 volts. Typically, $+V$ is ordinarily in the range of about $+5$ to $+12$ volts. In any event, the peak to peak excursion $\Delta$ in the refresh line L is advantageously equal to at least about twice the threshold voltage of $T_2$. It is desirable that the threshold voltage of $T_3$ be more positive than that of the MOS capacitor $C_S$; otherwise somewhat higher frequencies should be delivered by the A.C. source 13, of the order of 100 to 1000 KHz or more.

Although the limits of the A.C. source 13 will thus be described as $+V$ and $+(V+\Delta)$; nevertheless, it should be remarked that these limits can be advantageously set at $+(V-V_T)$ and $+(V-V_T+\Delta)$ where $V_T(>0)$ is the sum of the threshold voltage of $T_2$ and $T_3$ (where $T_2$ usually predominates). These latter limits can be achieved by means of a free running oscillator which feeds a bootstrap type integrated driver circuit, as described for example in a paper by R. E. Joynson et al, *IEEE Journal of Solid State Circuits*, Vol. SC-7, No. 3, pp. 217–224 (June 1972) entitled: 37 Eliminating Threshold Losses in MOS Circuits by Bootstrapping Using Varactor Coupling." The upper and lower voltage limits of the A.C. source can both be simultaneously lowered for a given A.C. excursion $\Delta$(peak to peak). The output of the A.C. source 13, in any event need not be in phase with, or synchronized with, any other voltage sources.

The refresh network will now be described in detail. The transistor $T_2$ has its drain terminal (right-hand terminal of $T_2$) ohmically coupled to refresh line L, by way of a highly conductive ohmic path. The gate electrode of $T_2$ is ohmically coupled to the drain terminal of $T_3$. The gate electrode of $T_3$ is ohmically coupled to the source of $T_3$ (node 14) and to the source of $T_2$. The node F (at the gate electrode of $T_2$) is A.C. coupled through the auxiliary bypass capacitor $C_L$ to the refresh line L. Advantageously, the capacitance of $C_L$ is greater than the sum of the parasitic capacitances of the node F to the semiconductor body, to the gate of $T_3$, and to the source of $T_3$; however, capacitance values of $C_L$ somewhat less than this can be used in conjunction with larger refresh voltage excursions $\Delta$. On the other hand, the capacitance of $C_L$ is advantageously less than the MOS capacitance $C_S$, advantageously by a factor of about 5 or more, in order to minimize the required value of the refresh voltage excursion $\Delta$. Thus, very little of the A.C. voltage drop between the refresh terminal 13.1 and the terminal $V_{DD}$ appears across the auxiliary capacitor $C_L$; so that the voltage at node F, when $T_3$ is "off", follows quite closely the oscillating voltage on the refresh line L. Since during operation, as explained more fully below, $T_3$ indeed is always "off" whenever the memory state of the storage capacitor $C_S$ is 0 (empty cell), and is always "on" whenever this memory state is 1 (full cell) therefore, $T_2$ can turn "on" only when the memory cell is in its 0 (empty) state. Thus, when the A.C. excursion of the refresh line is in its more positive portion (with the transistor $T_3$ "off") an empty cell will be refreshed by the migration of negative charge carries from the semiconductor portion 10 of the capacitor $C_S$ through $T_2$. In this way, the memory state of $C_S$ is preserved, in the case of either a 1 state or 0 state, as may be seen more clearly from the following somewhat more detailed explanation (N-MOS technology).

When the storage capacitor $C_S$ is empty, the transistor $T_3$ is always "off", regardless of the voltage excursions on the refresh line L, simply because an empty capacitor $C_S$ means that the surface potential at the semiconductive portion 10 (of the same semiconductor body in which $T_3$ and $T_2$ are integrated) is then equal to the back-gate bias voltage $V_{BG}$, and hence this back-gate bias is applied to the gate electrode of transistor $T_3$ through the ohmic coupling thereto from the seimconductive portion 10. Accordingly, the node F is then electrically disconnected ("floating"), and the A.C. voltage at this node therefore is being pulled by the A.C. voltage on the refresh line via the capacitor $C_L$; thereby, the transistor $T_2$ periodically is turned "on" when the refresh line voltage periodically reaches its more positive phases. Accordingly, the refresh line is periodically connected through the high current, source-drain path of $T_2$ to the semiconductive portion 10 of the storage capacitor $C_S$; thereby, any surplus negative charge carriers in this semiconductive portion 20 are periodically removed by the refresh line. Accordingly, the empty state of the memory cell is maintained as desired.

When the storage capacitor $C_S$ is full (negative charge in the semiconductive portion 10), transistor $T_3$ is always "on" because then its gate electrode is at a sufficiently negative potential (almost $-V_{DD}$) due to the ohmic coupling between this electrode and the then inverted semiconductive portion 10. Hence, the node F will then be conductively coupled through the high current path of $T_3$ to the thus inverted surface portion of $C_S$ regardless of the instantaneous voltage on the refresh line L, and therefore the node F will likewise be at a sufficiently negative potential to maintain the transistor $T_2$ in its "off" state. Accordingly, the semiconductive portion 10 is disconnected from the refresh line L regardless of the periodic voltage excursions of the refresh line L, and therefore the charge in the full storage cell will not be affected by the refresh line through $T_2$ in this case of a full cell.

For the purpose of ensuring proper operation, the threshold voltage of $T_3$ is adjusted, for example by suitably doping the gate region with impurities to a concentration such that $T_3$ is "off" whenever the storage capacitor $C_S$ is in its empty condition (digital 0), and that $T_3$ is "on" whenever the storage capacitor $C_S$ is in its full condition (digital 1). Thus, the threshold voltage of $T_3$ advantageously is adjusted so that it is approximately midway between the surface potentials in $C_S$ corresponding to full and empty cells. On the other hand, the threshold of $T_2$ advantageously is in any event adjusted to be less than that of $T_3$, i.e. between the threshold of $T_3$ and the back-gate bias $V_{BG}$.

Figure 2:
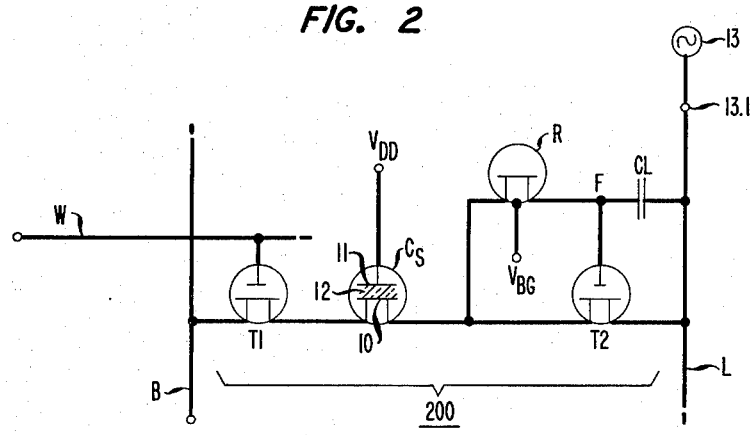
FIG. 2 is an alternative embodiment of the invention.

As shown in FIG. 2, the transistor $T_3$ can be replaced by a threshold resistor element R. This element R can be realized in a practical manner by omitting the gate electrode of $T_3$ and thereby forming a two-terminal threshold resistor, that is, a resistor exhibiting extremely high resistance whenever the voltage on either of its terminals is more negative than a threshold. This threshold is determined, inter alia, by the back-gate bias voltage $V_{BG}$; that is, R is characterized by extremely high resistance when the voltage on of its terminals is more negative than approximately the back-gate bias voltage. By "extremely high" resistance is meant essentially the same resistance characteristic as that of the corresponding transistor $T_3$ (FIG. 1) in its "off" state. In this way, similar operation can be obtained in the refresh network 200 as in the above-described operation of the network 100.

Although this invention has been described in detail with reference to a specific embodiment, various modifications can be made without departing from the scope of the invention. For example, P-MOS (or P-channel) technology can be used instead of N-MOS. Moreover, during access for read-out or write-in ($T_1$ is "on"), the voltage source 13 can be modified from pure A.C. as indicated in the above-mentioned U.S. Pat. No. 4,030,083 (FIG. 4 thereof). Also, bipolar or junction field effect transistors can be used instead of MOS transistors; and P-N junction or other types of capacitors can be used as the storage cell instead of the MOS capacitor.

I claim:

1. Semiconductor apparatus including a network for refreshing the memory state of a semiconductor capacitor memory cell ($C_S$) comprising a first transistor ($T_2$), one of whose high current carrying terminals is DC coupled to one terminal of the capacitor, and another of whose high current terminals is DC coupled to a refresh line terminal (13.1), characterized in that, a low current carrying terminal of the first transistor ($T_2$) is DC coupled to one terminal of a two-terminal threshold resistive element ($T_3$ or R) whose other terminal is DC coupled to said one terminal of the first transistor ($T_2$).

2. Apparatus according to claim 1 in which all said couplings are ohmic.

3. Apparatus according to claims 1 or 2 which further includes a bypass capacitor arranged to provide AC coupling between said low current terminal of the first transistor ($T_2$) and said refresh line terminal (13.1).

4. Semiconductor apparatus including a random access MOS memory cell comprising:
   (a) a first MOS transistor, whose source is ohmically coupled to a bit line, and whose gate electrode is ohmically coupled to a work line;
   (b) an MOS storage capacitor, one of whose terminals is ohmically coupled to said bit line, the other of whose terminals is ohmically coupled to a voltage source terminal;
   (c) a second MOS transistor, whose source is ohmically coupled to said one terminal of the storage capacitor, and whose drain is ohmically coupled to a refresh line; and
   (d) a threshold resistor, one of whose high current terminals is ohmically coupled to said source of the second MOS transistor, and the other of whose high current terminals is ohmically coupled through an auxiliary MOS capacitor to said drain of the second transistor.

* * * * *

UNITED STATES PATENT AND TRADEMARK OFFICE
CERTIFICATE OF CORRECTION

PATENT NO. : 4,292,677
DATED : September 29, 1981
INVENTOR(S) : Harry J. Boll

It is certified that error appears in the above–identified patent and that said Letters Patent are hereby corrected as shown below:

Column 6, line 45, "work" should read --word--.

Signed and Sealed this

Eighth Day of December 1981

[SEAL]

Attest:

Attesting Officer

GERALD J. MOSSINGHOFF

Commissioner of Patents and Trademarks